United States Patent [19]

Nakamura

[11] 4,302,728
[45] Nov. 24, 1981

[54] ULTRASONIC WAVE OSCILLATOR CIRCUIT WITH OUTPUT METER

[75] Inventor: Masahiro Nakamura, Tokyo, Japan

[73] Assignee: Ohtake Works Company, Ltd., Tokyo, Japan

[21] Appl. No.: 81,589

[22] Filed: Oct. 3, 1979

[30] Foreign Application Priority Data

Dec. 28, 1978 [JP] Japan ................ 53-161087

[51] Int. Cl.$^3$ .................. H03B 5/38; H03L 7/08
[52] U.S. Cl. ..................... 331/25; 310/316; 318/116; 331/64; 331/154; 366/116
[58] Field of Search ............ 331/18, 25, 64, 154, 331/158, 1 R; 310/314, 316; 318/116, 118; 366/116; 324/141, 142

[56] References Cited

U.S. PATENT DOCUMENTS 1,745,722  2/1930  Simpson ................. 324/142 X
3,068,411  12/1962  Galman .................. 324/142
4,056,761  11/1977  Jacoby et al. ........... 318/116

Primary Examiner—Siegfried H. Grimm

Attorney, Agent, or Firm—Jordan and Hamburg

[57] ABSTRACT

An oscillation system, having a vibrator, a resonant bridge and a low resistance, oscillates at desirable frequencies by receiving an excitation signal amplified to a predetermined value by an amplifier. A detection feedback signal containing the resonant frequency of the vibrator is input to a phase shift circuit. The phase shift circuit adjusts the phase of the detection feedback signal and the excitation signal to satisfy the oscillation condition. The output signal from the phase shift circuit is input to a PLL comprised of a phase comparator, a low pass filter, an amplifier and a voltage controlled oscillator. The frequency of the output signal from the PLL follows the resonant frequency of the vibrator and is locked. Its output signal is applied to the amplifier which feeds the oscillation system. An analog multiplier circuit is fed with signals proportional to the current and voltage from the resonant bridge circuit, and outputs the product of these signals. The output of the multiplier circuit is rectified and applied to a DC meter for indicating power consumption of the vibrator.

6 Claims, 3 Drawing Figures

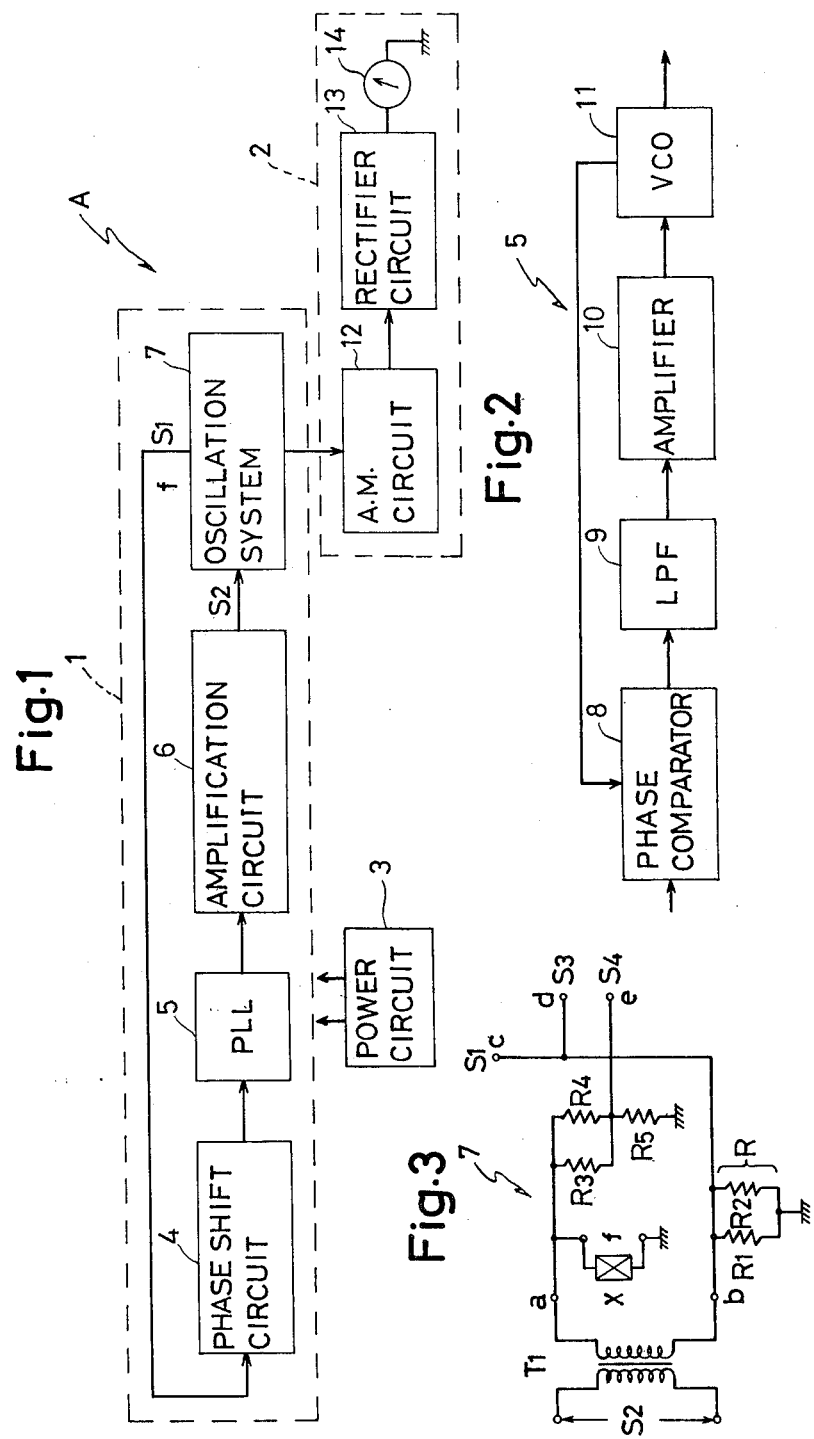

ULTRASONIC WAVE OSCILLATOR CIRCUIT WITH OUTPUT METER

This invention relates to an ultrasonic wave oscillator capable of controlling ultrasonic oscillation to a predetermined frequency in a follow-up manner. Such oscillations are widely utilized in ultrasonic machining, cleaning, cell breaking, etc.

In ultasonic oscillators, in general, it is unavoidable that the resonance frequency shifts due to variations in load and in the temperature of the oscillator, resulting in the fluctuation of ultrasonic oscillation. In an attempt to remedy such a drawback, there have been proposed various ultrasonic oscillators. For example, in the oscillation feedback system, a pressure sensor is bonded to a part of a vibrator and voltages generated in proportion to oscillation are fed back to the oscillator side to effect an automatic follow-up. But this proposed system is disadvantageous in that the temperature rise during operation can weaken the bonding force for the pressure sensor to the vibrator or a strong oscillation can cause the pressure sensor to come off from the oscillator, thus requiring a complicated connection.

Furthermore, the use of a thermocouple-type wattmeter to measure the power consumption of the vibrator, results in high costs.

It is an object of this invention to provide an ultrasonic wave oscillator with an output meter capable of operation in a stable manner through introduction of an IC-configured PLL not requiring a piezo-electric ceramic or the like as a mechanical electroconversion sensor.

It is another object of this invention to provide an ultrasonic wave oscillator with an output meter which does not use a thermocouple.

Other objects of this invention will become apparent from the following description taken in connection with the accompanying drawing.

FIG. 1 is a block diagram of this invention;
FIG. 2 illustrates the PLL used in this invention; and
FIG. 3 is a circuit diagram of an oscillation system.

An embodiment of an ultrasonic wave oscillator circuit with an output meter circuit, A, according to this invention is described below with reference to FIGS. 1 through 3.

The ultrasonic wave oscillator circuit with an output meter, A, is comprised of an oscillator circuit (1) and an output meter circuit (2), which are supplied with a predetermined voltage from a power circuit (3).

The oscillator circuit (1) comprises successively connected phase shift circuit (4), PLL (Phase Locked Loop) (5), amplification circuit (6) and oscillation system (7), and it is constructed so that a detection feedback signal (S1) obtained from a magneto- or electrostriction-utilizing vibrator (X) (FIG. 3) which constitutes the oscillation system (7), can be fed back to the input side of the phase shift circuit (4).

Therefore, the detection feedback signal (S1), as a peak current of oscillation containing a resonant frequency (f) of the vibrator (X) is fed back to the phase shift circuit (4) and thence to the input of the PLL (5). The frequency of the output signal from the PLL (5) varies according to the frequency of the detection feedback signal (S1), namely the resonant frequency (f) of the vibrator (X), and it is locked. The output signal from PLL (5) is input to the amplification circuit (6) where it is amplified to a predetermined value, and then is fed as an excitation signal (S2) to the vibrator (X) of the oscillation system (7). Both the excitation signal (S2) and the detection feedback signal (S1) are subjected to phase adjustment in the phase shift circuit (4) so as to satisfy the oscillation condition.

The phase shift circuit (4) receives the detection feedback signal (S1) containing the resonance frequency (f) of the vibrator (X), and functions to adjust the phase of (S1) so that the excitation signal (S2) of the vibrator (X) output from the post-amplification circuit (6) satisfies the oscillation condition. For example, it adjusts the phase according to variations of a variable resistor or the like. It also contains a limiter for maintaining the input of the detection feedback signal (S1) constant.

The PLL (5), which may be comprised of an IC, comprises, for example as shown in FIG. 2, a double balance-type phase comparator (8), LPF (Low Pass Filter) (9), a single differential-type amplifier (10) and a Schmitt trigger-type VCO (Voltage Controlled Oscillator) (11). In this invention, the phase comparator (8) and VCO (11) are used as the input and output, respectively.

The input signal to the phase comparator (8) of the PLL (5), though somewhat phase-adjusted by the phase shift circuit (4), is virtually of the same component as the resonance frequency (f) of the vibrator (X), which is the frequency of the detection feedback signal (S1). The free-running frequency of the VCO (11) is set so as to coincide with the resonance frequency (f) of the vibrator (X), Therefore, if there is no variation in the resonant frequency (f) of the vibrator (X), the output frequency from VCO (11) is locked to the said resonant frequency, whereby the oscillation is stable.

On the other hand, if the resonant frequency (f) of the vibrator (X) varies due to a change in load or from other cause, the frequency component of the detection feedback signal (S1) also varies accordingly. The detection feedback singal (S1) is input through the phase shift circuit (4) to the phase comparator (8) of PLL (5).

In the phase comparator (8), a comparison of frequency and phase is made with the output frequency of VCO (11) to be fed back, to generate a difference signal voltage according to the difference, which is fed to the control terminal of VCO (11) through LPF (9) and amplifier (10), and the oscillation frequency thereof is controlled in the direction in which the difference from the input detection feedback signal (S1) is diminished. That is, the output frequency of PLL (5) varies in response to the resonant frequency (f) of the vibrator (X) and at the same time it is locked to assure the continuation of a stable oscillation.

The amplification circuit (6) is comprised of a pre-amplification circuit and a power amplification circuit, and is adapted to provide a predetermined output. The output from the amplification circuit (6) is fed as excitation signal (S2) to the vibrator (X) of the oscillation system (7) through an output transformer (T1) as is shown in FIG. 3.

As illustrated in FIG. 3, the oscillation system (7) is formed on the secondary side of the output transformer (T1) of the amplification circuit (6), in which the vibrator is connected between terminal (a) and ground, while connected between terminal (b) and ground is a low resistance (R) as an output device of the detection feedback signal (S1), the resistance (R) consisting of resistors (R1) and (R2) connected in parallel. In other words, the vibrator (X) and the low reistance (R) are connected in series with its junction grounded, then connected between the terminals (a) and (b) on the secondary side of the output transformer, (T1), and across the vibrator (X) are connected the resistors (R3) and (R4) in parallel is further connected in series a resistor (R5), the bridge connection thus constitutes a resonant circuit.

From a terminal (c) of the so-formed oscillation system (7) is obtained the detection feedback signal (S1) containing the resonant frequency (f) of the vibrator (X), while from terminals (d) and (e) can be drawn a current proportional signal (S3) and a voltage proportional signal (S4) which are proportional to the current and voltage values consumed in the vibrator (X), respectively.

The output meter circuit (2) is comprised of an analog multiplier circuit (12), a rectifier circuit (13) and a DC meter (14).

The analog multiplier circuit (12) is fed with the current proportional singal (S3) and the voltage proportional signal (S4) from the terminals (d) and (e) of the oscillation system (7) of the oscillator circuit (1), and outputs the product of both singals (S3) (S4) as an analog signal which corresponds to the power consumption of the vibrator (X).

The rectifier circuit (13) converts the analog signal output from the analog multipler circuit (12) into a direct current signal by full-wave rectification, which d.c. signal is then fed to a DC meter (14). The reading on the DC meter (14) directly indicates power consumption because the DC meter (14) is graduated in terms of power consumption.

Thus, the oscillator circuit (1) of this invention uses PLL (5) which may be an IC, whereby even if the resonance frequency (f) of the vibrator (X) varies due to a change in load or in the temperature of the vibrator (X), the output frequency of the PLL (5) varies in the follow-up manner, so it is possible to attain the stabilization of ultrasonic oscillation. Furthermore, the detection feedback signal (S1) is detected not by a pressure sensor or detection coil as in the prior art, but through the low shunt resistance (R) which is separated from the vibrator (X), so that troubles based on temperature rise or vibration can be prevented.

This invention is further advantageous in that to measure the power consumption of the vibrator (X), conventional apparatus have adopted an expensive thermocouple-type wattmeter, while this invention permits manufacture of a relatively cheap meter for the same purpose.

What we claim is:

1. An ultrasonic wave oscillator circuit having an output meter circuit comprising: an oscillation system including a vibrator for generating a resonant frequency and simultaneously for generating a detection feedback signal, a resonant bridge circuit coupled to said vibrator and sensitive to a change of frequency, and a low resistance coupled to said vibrator for providing said detection feedback signal; a phase shift circuit having a limiter for adjusting the phase of both said detection feedback signal and an excitation signal to satisfy an oscillation condition; a phase locked loop (PLL) including a voltage controlled oscillator (VCO) and phase comparator for comparing the frequency and phase of the output of the phase shift circuit with an output frequency of the VCO for generating a difference signal, an amplifier, a low pass filter connected to apply said difference signal, having a frequency below a predetermined value, through said amplifier to said VCO, whereby the oscillation frequency of said VCO is controlled in the direction in which said difference signal is reduced; a second amplifier for amplifying the output of said PLL to a predetermined value and for outputting an excitation signal to said vibrator; an analog multiplier circuit connected to output a product of a current proportional signal and a voltage proportional signal from said resonant bridge circuit as an analog signal corresponding to a power consumption of said vibrator; a rectifier circuit for converting said analog signal to a direct current signal; and a direct current meter connected to indicate said direct current signal as the power consumption of said vibrator.

2. The ultrasonic wave oscillator circuit of claim 1, in which said oscillation system includes a low resistance connected in series to said vibrator, as an output device for said detection feedback signal, in the resonant bridge circuit of said vibrator.

3. The ultrasonic wave oscillator circuit of claim 1, in which said vibrator and said low resistance are connected in series, with the junction thereof grounded, and are connected across the secondary side of an output transformer.

4. The ultrasonic wave oscillator circuit of claim 1, in which said limiter holds the input of said detection feedback signal to a fixed value level.

5. An ultrasonic wave oscillator comprising an oscillation system including a vibrator, an input transformer having a secondary winding, a first output resistance means connected in series with said vibrator and said secondary winding, and second resistance means connected in parallel with said vibrator, said oscillator further comprising a phase shift circuit, means applying the voltage across said first resistance means to said phase shift circuit, a phase locked loop for receiving the output of said phase shift circuit and for producing an output oscillation corresponding to the difference between the output of said phase shift circuit and voltage controlled oscillation generated therein, and means for amplifying the output of said phase locked loop for application to the primary winding of said transformer.

6. The ultrasonic wave oscillator of claim 5, further comprising means for multiplying signals corresponding to the voltages across at least a part of said first and second resistance means for producing a signal corresponding to energy consumption in said vibrator, and indicator means responsive to said energy consumption signal.

* * * * *